United States Patent
Dagnachew et al.

(12)
(10) Patent No.: US 6,236,345 B1
(45) Date of Patent: May 22, 2001

(54) VIDEO RATE D/A CONVERTER WITH SIGMA-DELTA MODULATOR

(75) Inventors: Birru M. Dagnachew, Sleepy Hollow, NY (US); Engel Roza, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/299,526

(22) Filed: Apr. 26, 1999

(30) Foreign Application Priority Data

Apr. 24, 1998 (EP) .................................................. 98201318

(51) Int. Cl.[7] .................................................... H03M 3/00
(52) U.S. Cl. ............................................. 341/143; 375/240
(58) Field of Search ..................................... 341/143, 144, 341/147; 708/319; 382/260; 375/240; 348/623; 386/109

(56) References Cited

U.S. PATENT DOCUMENTS

| | | | |
|---|---|---|---|
| 4,782,324 | * 11/1988 | Underwood | 341/147 |
| 5,283,578 | 2/1994 | Ribner et al. | 341/143 |
| 5,323,157 | 6/1994 | Ledzius et al. | 341/143 |
| 5,579,004 | * 11/1996 | Linz | 341/144 |
| 5,585,802 | 12/1996 | Cabler et al. | 341/144 |

* cited by examiner

*Primary Examiner*—Patrick Wamsley

(57) ABSTRACT

A D/A converter (DAC) is described having interpolation means (1) and filter means. Further the D/A converter comprises a noise shaper (3) implemented as a reduced sample rate (RSR) sigma delta modulator, and controlled by clock means. To further improve the operation of the D/A converter in an advantageous embodiment of the invention the filter means are implemented as polyphase FIR filter means.

5 Claims, 3 Drawing Sheets

DAC 2

VIDEO RATE D/A CONVERTER WITH SIGMA-DELTA MODULATOR

The invention relates to a D/A converter according to the preamble of claim 1.

The invention further relates to a method for converting a digital input signal into an analogue output signal according to the preamble of claim 4.

A lot of D/A converters for audio signals are known. There are two basic techniques used in digital-to-analogue converters (D/A converters). These are the so called sigma-delta technique and the resistive or capacitive divider techniques. The sigma-delta technique is attractive because it achieves high resolution by precise timing instead of precisely-matched on-chip components such as resistors. In addition, the expertise needed to produce thin film, laser-trimmed analogue components is difficult to obtain; whereas, high-speed digital switching capability is commonplace in the semiconductor industry.

A basic sigma-delta D/A converter receives a digital input signal which is summed with inverse feedback of the output signal to provide an error signal. The error signal is then processed through an integrator and a comparator to provide the so called bit-stream output signal. This signal conversion technique of using time resolution instead of amplitude resolution matches very well with present CMOS technology with its reduction of power supply voltage and the increase of the intrinsic speed of the transistors. The sigma-delta D/A converter is able to shape the quantisation noise out of the signal band, and any noise beyond that range is filtered out by the subsequent analogue filter in an ideal implementation.

Sigma-delta modulators often require oversampled signals which can be provided by an interpolator. The D/A converter's input signals may be at the so called Nyquist rate or may require interpolation to a higher rate before being provided to the sigma-delta modulator. The sigma-delta modulator is clocked using a high-speed digital clock, which may be different from the D/A converter's input clock.

Such a D/A converter is known from the U.S. Pat. No. 5,585,802.

This known D/A converter comprises a sigma delta modulator as a so called noise shaper followed by filter means.

Such D/A converters are intensively used in voice band and audio band applications but are hardly used in large bandwidth applications such as in the video domain.

Disadvantages of the known D/A converters are that to use these D/A converters for full bandwidth video signals operation frequencies beyond 200 MHz are necessary. Such very high speed circuits are difficult to accomplish. Further this very high speed circuitry dissipates (too) much power.

Another disadvantage is that the filter means used in the known D/A converters requires a large number of so called taps (multiplication's).

SUMMARY OF THE INVENTION

So these known D/A converters are not suitable for video signals.

An object of the invention is to overcome the disadvantages of the prior art, to provide a D/A conversion suitable for full bandwidth video signals.

To this end a first aspect of the invention provides a D/A converter as claimed in claim 1. A second aspect of the invention provides a method as claimed in claim 4.

By reducing the sample rate of the sigma delta modulator this D/A converter is able to handle full bandwidth video signals without needing clockfrequencies beyond 200 MHz.

An embodiment of a D/A converter according to the invention comprises the features of claim 2.

Instead of using a normally used parallel to serial converter (which requires a 216 MHz clock) the D/A converter according to the invention employs a polyphase post processing combined with an (for example on chip) filtering.

By using a polyphase filtering the clock frequency can be reduced.

An embodiment of a D/A converter according to the invention comprises the features of claim 3.

By using a delay locked loop (DLL) the clock frequency of the polyphase FIR filter means can be easily obtained from the clock frequency of the reduced rate sample rate sigma delta modulator.

BRIEF DESCRIPTION OF THE DRAWINGS

The invention and additional features may optionally be used to implement the invention to advantage will be apparent from and elucidated with reference to the examples described below hereinafter and shown in the figures. Herein shows.

Corresponding reference numerals will be used throughout the description for corresponding elements.

DESCRIPTION OF THE PREFERRED EMBODIMENTS

Figure 1:
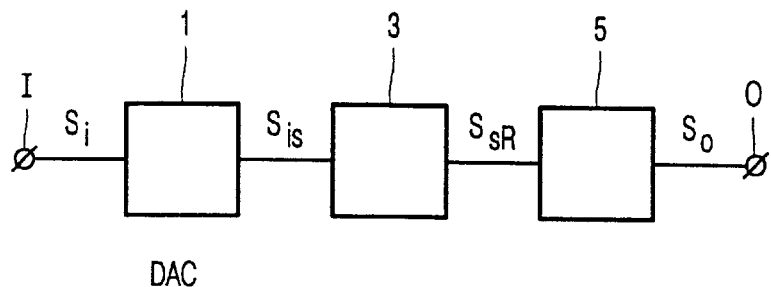
FIG. 1 a block schematic example of a D/A converter according the invention.

FIG. 1 shows a block schematic example of a D/A converter DAC according to the invention comprising an input I for receiving a digital input signal Si. This signal is supplied to interpolation means 1 for interpolation this input signal into an interpolated signal Sis. By interpolation the input signal is upsampled by for example a factor four. This interpolated signal Sis is supplied to a noise shaper 3 comprising a reduced sample rate (RSR) sigma delta modulator.

The RSR modulator produces parallel samples. The overall configuration is designed in such a way that when the samples are converted to a serial sequence in time using a simple parallel-to-serial converter (P/S) the spectra of this serial sequence and that of the output of a conventional sigma delta modulator are the same within an acceptable error.

The RSR sigma delta modulator is able to handle full bandwidth video signals at a reduced sample rate of for example 54 MHz instead of the necessary about 216 MHz with conventional sigma delta modulators.

The noise shaper supplies an intermediate signal Ssr to filter means 5 for processing (including filtering) this signal.

After processing the D/A converter DAC supplies at an output O an analogue output signal So.

Figure 2:
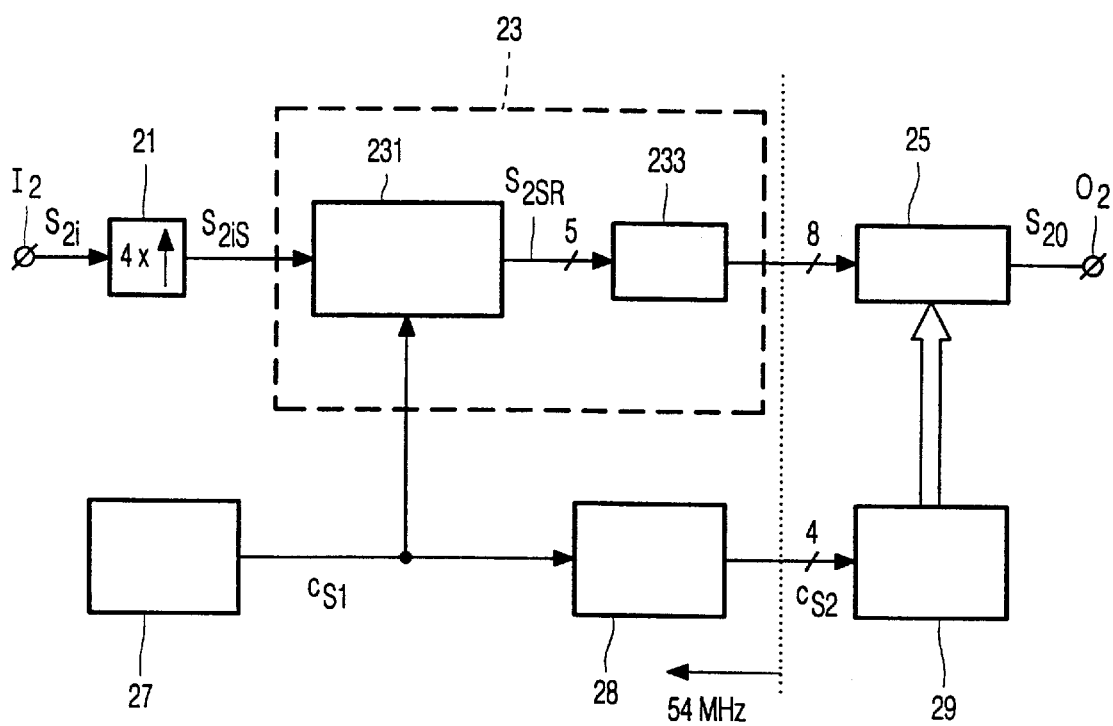
FIG. 2 a more detailed block schematic example of a D/A converter according to the invention, and FIG. 3 an example of filter means according to the invention in more detail.

FIG. 2 shows a detailed block schematic example of a D/A converter DAC2 according to the invention. At the input 12 the D/A converter receives a digital 8-bit input signal S2$i$ at a 13.5 MHz rate. This input signal is supplied to an upsampler (in this example a factor 4). The interpolation means supply the interpolated signal S2 is to a noise shaper 23 comprising a second order RSR sigma delta modulator 231 and an encoder 233.

The noise shaper 23 is coupled via filter means 25 to an output O2 of the D/A converter for supplying an analogue output signal S2o.

The RSR sigma delta modulator 231 is controlled by first clock means 27, in this example with a clock signal cs1 with a clock frequency of 54 MHz. By using the RSR sigma delta modulator the D/A converter according to the invention is able to handle video signals at a reduced sample rate.

The encoder 233 converts the intermediate signal format (5 bits in this example) into a 8-bit format that is suitable for the subsequent filter.

The clock means 27 also supply the clock signal cs1 to a delay lock loop (DLL) 28. This delay lock loop obtains 4-phase equidistant-time clocks with clock signals cs2 with four phase differences. These signals are supplied to a second clock means 29, which second clock means control the filter means 25 with a clock frequency which is in this example 2 times the clock frequency of the RSR sigma delta modulator.

In this way it is possible to handle full bandwidth video signals without needing to operate the sigma delta modulator and the filter means with a clock frequency as high as 54×4=216 MHz.

Instead of using a known normally used parallel to serial converter (which requires a 216 MHz clock) this converter employs a polyphase post processing combined with an (for example on chip) filtering.

By using a polyphase filtering a reduced clock frequency can be used.

Figure 3A:
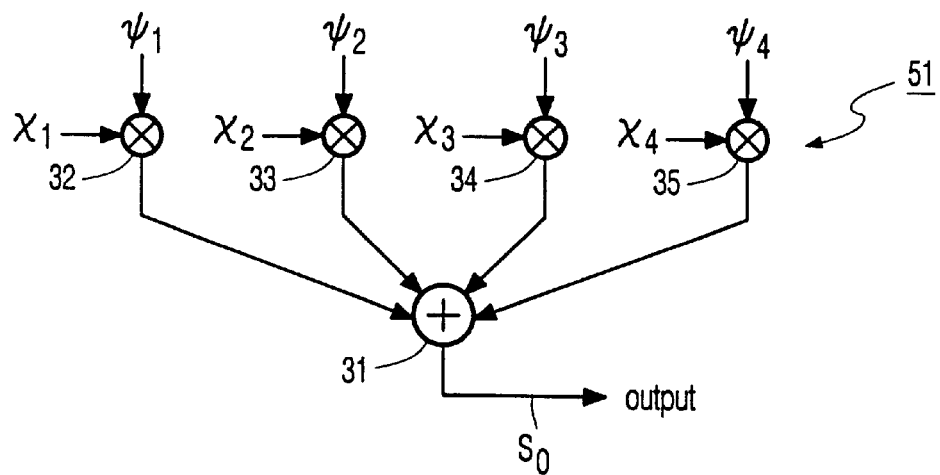
Figure 3B:
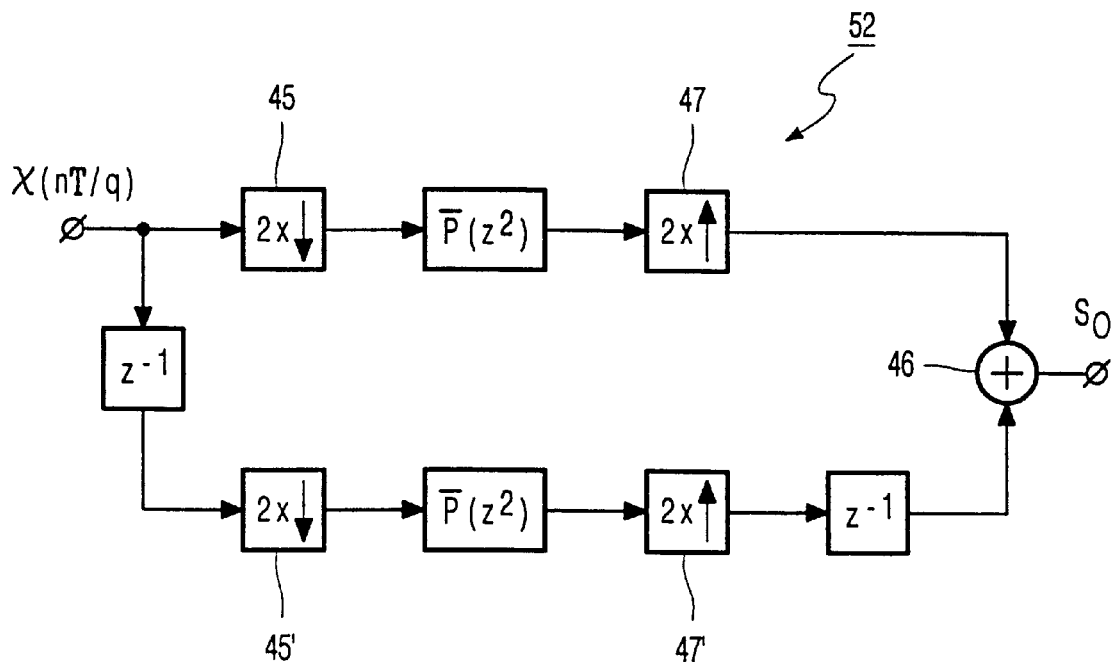
Figure 3C:
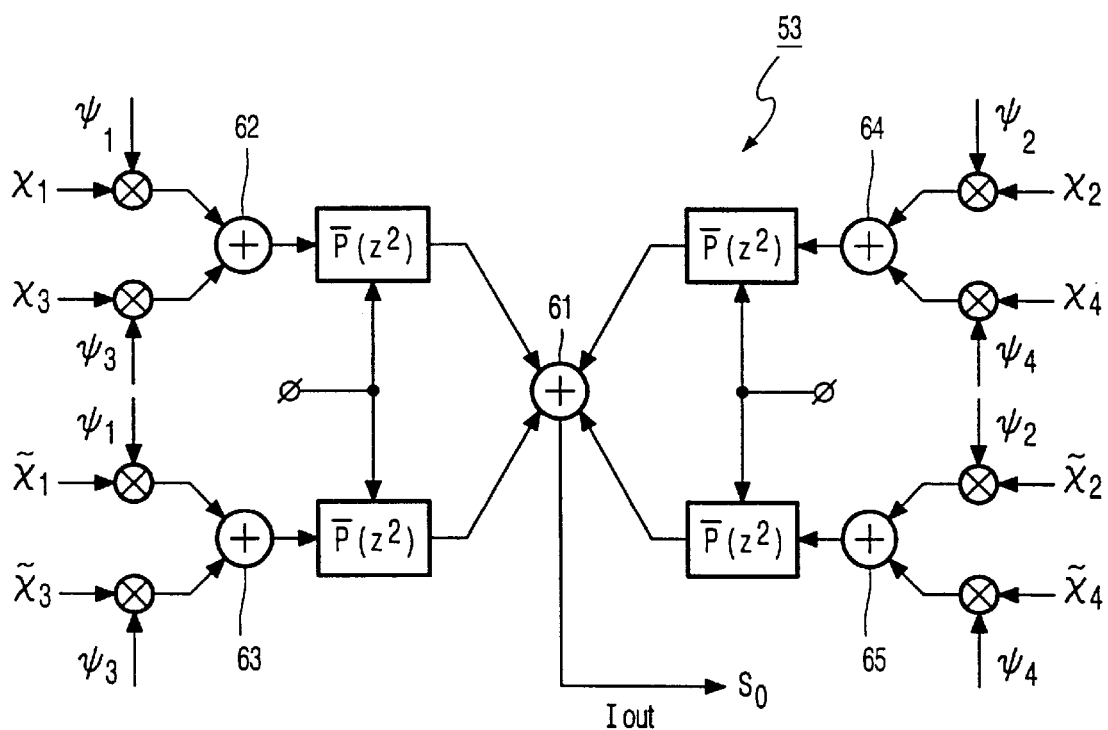

In FIG. 3 the filter means 51, 52, 53 respectively FIG. 3a, 3b and 3c are shown in simplified form (51, FIG. 3a), as a signal processing scheme (52, FIG. 3b), and as implementation scheme (53, FIG. 3c).

The filter means operate as a so called post processor. The post processor is in this example implemented as a semi-digital circuit containing a polyphase parallel-to-serial converter and a current mode linear-phase FIR reconstruction filter. The polyphase post-processing, controlled by the timing generated from the 4-phase equidistant time clocks (the output of the DLL, 28, see FIG. 2), serves to serialize the parallel bits. Instead of using a simple parallel-to-serial converter (which requires a 216 MHz clock), this example of the D/A converter employs polyphase post-processing combined with extra on-chip filtering.

The main motivation for using polyphase post-processing is to reduce the required on-chip clock frequency while that for using an on-chip filter is to significantly simplify the requirements of an off-chip (video-) filter. The filter integrated in this example allows the external filter to be reduced to, typically, a single RC section.

FIG. 3a shows a simplified form of polyphase post-processing (polyphase serialization) involving forming an output (signal So) which is a linear combination, adder 31, of the outputs of the modulators $x_n$ (32, 33, 34, 35) with each element of $x_n$ modulated by identical phase-shifted waveforms as illustrated in FIG. 3a. The simplest form of the modulating waveforms ($\psi$s) may be a phase-shifted train of pulses with identical pulse widths. The spectrum of the serialized sequence will then be modified by the spectrum of this train of pulses (clock). Depending on the pulse width, this modifying is a desired effect in that it attenuates part of the outband spectrum (which is noise), and consequently simplifies the requirements of the subsequent reconstruction filter.

One step further in simplifying the complexity of an external filter is to use a transversal FIR filter which provides sufficient attenuation in part of the outband spectrum. Such a filter can be implemented in a polyphase form so that the need for a high-frequency clock is avoided.

FIG. 3b shows an example of a discrete-time representation of equivalent two-phase filtering implemented in this D/A converter, whose input is the serialized sequence. The filtering is composed of two identical linear-phase (symmetrical) 17-tap low-pass FIR filters, $\tilde{P}(z^2)$, each operating at half the rate of the bitstream sequence (in this example at 108 Mhz). In each path a downsampler 45, 45' respectively is placed before the filter. The total operation of this two-phase processing is equivalent to filtering the serialized sequence X[NT/q] through a half-band linear phase 33-tap Low-pass FIR filter, P(z), operating at the bitstream rate (in this example at 216 MHz). Every other sample of the impulse response of P(z) then equals zero whereas the non-zero samples equal the impulse response samples of $\tilde{P}(z^2)$. As shown in FIG. 3b, the output of each section is combined after upsampling in upsamplers 47, 47' respectively, in adder 46 in such a way that the final output sequence is identical to that of the output of the P(z) operating at a higher rate. The frequency response of such a half-band filter repeats at frequencies which are integer multiples of 108 MHz.

FIG. 3c shows the simplified implementation of the polyphase post processor. The output current of each filter is summed on a resistor. Each 2-bit output of the modulator is serialized by the control of the non-overlapping 54-MHz clocks (the $\psi$is) to result in a 1-bit 108 MHz data-rate input of each FIR filter. Two identical filters, controlled by identical phases of the clocks, are thus used to process each 4-bit output of the modulator. Since each switched current is kept constant for $2/f_{s+hd\ s}$ time (that is the pulse-width modulation effect), there is then an extra low-pass filtering with a frequency response of $\sin(2\pi f/fs)/(2\pi f/fs)$.

This filter contains structural zeros at frequencies that are non-zero integer multiplies of fs/2, which coincide at the frequencies that are not suppressed by P(z).

The overall effect of this reconstruction processing in this D/A converter is equivalent to filtering the simple serialized output of the modulator through the cascade of the 33-tap filter P(z), pulse-width modulation with a pulse width of 2/fs, and external RC filtering. The remaining high-frequency components are suppressed by the off-chip RC filtering, the capacitor being predominantly a small parasitic capacitance.

It is to be noticed that the described upsampling factor and the clock frequencies of the first and second clock means can be chosen at will.

The D/A converter can be fully integrated needing after the filtering means only a simple RC filtering outside the chip.

In the above description the idea of the invention has been described on the basis of a detail example. The man skilled in the art will be well aware of a lot different solutions that fall within the scope of the invention concerned.

The invention provides a D/A converter with a reduced sample rate sigma delta modulator.

Further the invention provides a post processing which is advantageously done by using a polyphase filtering.

What is claimed is:

1. D/A converter comprising an input for receiving a digital input signal, interpolation means for interpolating the input signal and supplying an interpolated signal, a noise shaper for converting the interpolated digital signal into an intermediate signal, and filter means for processing the intermediate signal and supplying an analogue output signal, characterized in that the noise shaper comprises a reduced sample rate sigma-delta modulator controlled by a clock means and able to handle full bandwidth video signals at a sample rate not exceeding 200 MHz.

2. D/A converter as claimed in claim 1, characterized in that the filter means comprise a polyphase FIR filter means.

3. D/A converter as claimed in claim 2, characterized in that the polyphase FIR filter means is controlled by second clock means with a clock frequency being higher than the clock frequency of the reduced sample rate sigma delta modulator, and coupled with the first clock means of the reduced sample rate sigma delta modulator via a delay locked loop.

4. Method for converting a digital input signal into an analogue output signal, comprising the interpolation of the input signal into an interpolated signal, the converting the interpolated signal into an intermediate signal, the processing of the intermediate signal and supplying the analogue output signal, characterized in that the converting is a reduced sample rate sigma-delta modulation able to handle full bandwidth video signals at a sample rate not exceeding 200 MHz.

5. Method as claimed in claim 4, characterized in that the processing of the intermediate signal being a polyphase FIR filtering.

* * * * *